US008059833B2

(12) United States Patent
Koh et al.

(10) Patent No.: US 8,059,833 B2
(45) Date of Patent: Nov. 15, 2011

(54) METHOD OF COMPENSATING AUDIO FREQUENCY RESPONSE CHARACTERISTICS IN REAL-TIME AND A SOUND SYSTEM USING THE SAME

(75) Inventors: You-kyung Koh, Seoul (KR); Sun-min Kim, Suwon-si (KR); Joon-hyun Lee, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1320 days.

(21) Appl. No.: 11/213,753

(22) Filed: Aug. 30, 2005

(65) Prior Publication Data

US 2006/0140418 A1 Jun. 29, 2006

(30) Foreign Application Priority Data

Dec. 28, 2004 (KR) ........................ 10-2004-0113702

(51) Int. Cl.
*H03G 5/00* (2006.01)
*H03G 3/00* (2006.01)

(52) U.S. Cl. ............... 381/98; 381/103; 381/60; 381/61

(58) Field of Classification Search .................... 381/98, 381/103, 320, 321, 61, 60
See application file for complete search history.

(56) References Cited

U.S. PATENT DOCUMENTS 4,476,724 A * 10/1984 Gotze ............................. 73/585
5,835,611 A * 11/1998 Kaiser et al. .................. 381/321
6,078,669 A * 6/2000 Maher ............................. 381/17
7,110,951 B1 * 9/2006 Lemelson et al. ............ 704/270
2002/0183648 A1 12/2002 Hou
2003/0063763 A1 4/2003 Allred et al.
2004/0202339 A1 10/2004 O'Brien, Jr. et al.
2005/0053249 A1 * 3/2005 Wu et al. ....................... 381/310
2005/0078838 A1 * 4/2005 Simon ............................. 381/98

FOREIGN PATENT DOCUMENTS

| | | |
|---|---|---|
| JP | 2002-259938 | 9/2002 |
| KR | 1991-6321 | 4/1991 |
| KR | 20-15739 | 6/2000 |

(Continued)

OTHER PUBLICATIONS

Korean Office Action dated May 25, 2006 of Korean Patent Application No. 10-2004-0113702.
Dutch Search Report dated Mar. 28, 2007 issued in Dutch Patent Application No. 1030541.
Chinese Office Action issued Dec. 11, 2009 in CN Application No. 200510101054067.

*Primary Examiner* — Xu Mei
(74) *Attorney, Agent, or Firm* — Stanzione & Kim, LLP

(57) ABSTRACT

A method of compensating audio frequency response characteristics of a portable sound system can be performed using acoustic characteristics of a user measured in real-time. The method of compensating the audio frequency response characteristics can be used by a portable sound system. The method includes generating an acoustic characteristics curve of a user based on a minimum perception level of a user with respect to audible audio frequency bandwidths, generating an acoustic compensation curve of the user based on the acoustic characteristics curve of the user and a predetermined frequency characteristics target curve, and compensating the audio frequency response characteristics of a sound based on the acoustic compensation curve of the user.

16 Claims, 6 Drawing Sheets

FOREIGN PATENT DOCUMENTS

| | | | |
|---|---|---|---|
| KR | 1996-12793 | | 12/2000 |
| KR | 2001-24463 | | 3/2001 |
| KR | 2002-0044416 | | 6/2002 |
| KR | 2002-44416 | A | 6/2002 |
| WO | WO 90/09760 | | 9/1990 |
| WO | WO 02/39784 | | 5/2002 |
| WO | WO 03/026349 | A1 | 3/2003 |
| WO | WO 2004/004414 | | 1/2004 |

* cited by examiner

METHOD OF COMPENSATING AUDIO FREQUENCY RESPONSE CHARACTERISTICS IN REAL-TIME AND A SOUND SYSTEM USING THE SAME

CROSS-REFERENCE TO RELATED APPLICATIONS

This application claims priority from Korean Patent Application No. 2004-113702, filed on Dec. 28, 2004 in the Korean Intellectual Property Office, the disclosure of which is incorporated herein in its entirety by reference.

BACKGROUND OF THE INVENTION

1. Field of the Invention

The present general inventive concept relates to a portable sound system, and more particularly, to a method of compensating audio frequency response characteristics of a portable sound system using acoustic characteristics of a user as measured in real-time, and a portable sound system using the same.

2. Description of the Related Art

Generally, a conventional portable sound system outputs music into a user's ears through earphones. The conventional portable sound system compensates for poor audio frequency response characteristics using a preset equalizer (e.g., having a modern rock mode and a jazz mode) without considering acoustic characteristics specific to the user when reproducing the music through the earphones in the user's ears. Therefore, the conventional portable sound system does not provide effective audio frequency response compensation for individual users because of the preset equalizer.

Acoustic characteristics differ for each individual user depending on the user's age, surroundings, health, etc. Therefore, since the conventional portable sound system compensates the audio frequency response characteristics according to a general standard on which the preset equalizer is based, the audio frequency response characteristics cannot be compensated according to each individual user.

The preset equalizer used with the conventional portable sound system typically has a rock or a jazz mode. However, the individual users cannot hear sound with an optimum quality because the preset equalizer does not accurately match the acoustic characteristics of the individual users.

SUMMARY OF THE INVENTION

The present general inventive concept provides a method of compensating audio frequency response characteristics in real-time using acoustic characteristics of a user measured in real-time.

The present general inventive concept also provides a portable sound system using the method of compensating audio frequency response characteristics in real-time.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a method of compensating audio frequency response characteristics of a sound system in real-time. The method includes generating an acoustic characteristics curve of a user based on a minimum perception level of the user with respect to audible audio frequency bandwidths, generating an acoustic compensation curve of the user based on the acoustic characteristics curve of the user and a predetermined frequency characteristics target curve, and compensating the audio frequency characteristics of a sound based on the acoustic compensation curve of the user.

The foregoing and/or other aspects of the present general inventive concept are also achieved by providing a method of reproducing sound in a sound system, the method comprising detecting acoustic characteristics of a user, and reproducing a sound signal and modifying a frequency response curve of the sound signal according to the detected acoustic characteristics of the user.

The foregoing and/or other aspects of the present general inventive concept are also achieved by providing a sound system, including a sound reproducing unit to reproduce a sound from a predetermined recording medium, an acoustic characteristics processing unit to generate an acoustic characteristics curve of a user based on a minimum perception level of the user with respect to an audible audio frequency band, an equalizer to generate filter coefficients that correspond to an acoustic compensation curve of the user based on the acoustic characteristics curve of the user and a predetermined frequency characteristics target curve, and a digital filter processing unit to compensate frequency characteristics of the sound reproduced by the sound reproducing unit according to the filter coefficients generated by the equalizer.

The foregoing and/or other aspects of the present general inventive concept are also achieved by providing a sound system, comprising a user acoustics unit to detect acoustic characteristics of a user, a sound reproducing unit to reproduce a sound signal, and a processing unit to modify a frequency response curve of the reproduced sound signal according to the detected acoustic characteristics of the user.

The foregoing and/or other aspects of the present general inventive concept are also achieved by providing a sound system, comprising a sound reproducing unit to reproduce a sound signal when the system is in a sound reproducing mode, and an acoustics measuring unit to generate a user-specific sound processing unit to process sound according user-specific acoustics and one or more user preferences in real time when the system is in a measuring mode.

The foregoing and/or other aspects of the present general inventive concept are also achieved by providing a method of compensating audio frequency response characteristics, the method comprising generating an acoustic characteristics curve by checking levels of each of a plurality of bands in a frequency domain, dividing the acoustic characteristics curve into curve bands of a predetermined width and setting a representative sound pressure level for each of the curve bands, calculating a difference between the representative sound pressure level of each of the curve bands and preset reference levels, and setting filter coefficients according to the calculated difference between the representative sound level of each of the curve bands and the preset reference levels.

The foregoing and/or other aspects of the present general inventive concept are also achieved by providing a computer readable medium containing executable code to compensate audio frequency response characteristics of a sound system in real-time, the medium comprising a first executable code to generate an acoustic characteristics curve of a user based on a minimum perception level of the user with respect to audible audio frequency bandwidths, a second executable code to generate an acoustic compensation curve of the user based on the acoustic characteristics curve of the user and a predetermined frequency characteristics target curve, and a third executable code to compensate the audio frequency response characteristics of a sound based on the acoustic compensation curve of the user.

BRIEF DESCRIPTION OF THE DRAWINGS

These and/or other aspects of the present general inventive concept will become more apparent by describing in detail exemplary embodiments thereof with reference to the attached drawings in which.

DETAILED DESCRIPTION OF THE PREFERRED EMBODIMENTS

Figure 1:
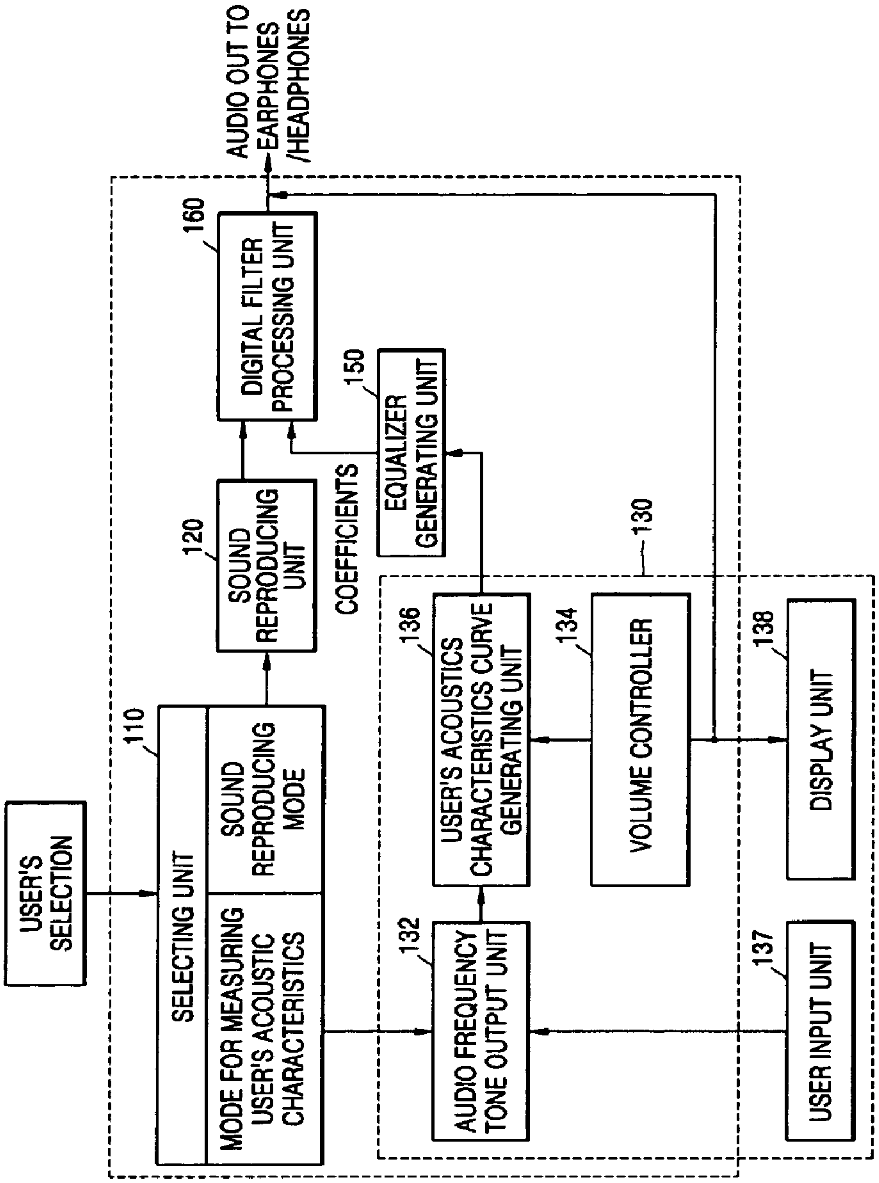
FIG. 1 is a block diagram illustrating a sound system using acoustic characteristics of a user according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIG. 1 is a block diagram illustrating a sound system using acoustic characteristics of a user according to an embodiment of the present general inventive concept.

Referring to FIG. 1, the sound system includes a selecting unit 110, a sound reproducing unit 120, an acoustic characteristics processing unit 130, an equalizer (EQ) generating unit 150, and a digital filter processing unit 160. Here, the acoustic characteristics processing unit 130 includes an audio frequency tone output unit 132, a user's characteristics curve generating unit 136, a volume controller 134, a user input unit 137, and a display unit 138.

The selecting unit 110 selects between a measuring mode to measure the acoustic characteristics of the user and a sound reproducing mode to reproduce sound according to a selection made by the user.

The sound reproducing unit 120 reproduces audio data that is read from a sound recording medium, such as a memory, as sound when the sound reproducing mode is selected by the selecting unit 110.

The acoustic characteristics processing unit 130 generates an acoustic characteristics curve of the user based on a minimum perception level of the user with respect to the audible audio frequency band when the sound system is in the measuring mode. In particular, the audio frequency tone output unit 132 outputs a plurality of audio signals for each of a plurality of audio frequency bands. The volume controller 134 controls an audio signal level (i.e., a volume) depending on the minimum perception of the user and outputs the plurality of audio signals to earphones or a headphone. The display unit 138 displays information about whether the audio signal level of a corresponding audio frequency band having the volume changed by the volume controller 134 is audible to the user. The user input unit 137 may comprise a button to be pressed by the user when the user begins to hear sound through the earphone or the headphone. The user's acoustic characteristic curve generating unit 136 sets a user acoustic level for each of the audio frequency bands when the sound becomes audible (i.e., the user begins to hear the sound) through the earphone or the headphone. Accordingly, the user's acoustics characteristics curve generating unit 136 generates the acoustic characteristics curve of the user based on the user acoustic level at the various audio frequency bands.

The EQ generating unit 150 generates an acoustic compensation curve by comparing the acoustic characteristics curve of the user generated by the acoustic characteristics processing unit 130 and an audio frequency characteristics target curve desired by the user. Accordingly, the EQ generating unit 150 generates filter coefficients that correspond to the acoustic compensation curve of the user.

The digital filter processing unit 160 compensates audio frequency response characteristics of the sound reproduced by the sound reproducing unit 120 according to the filter coefficients generated by the EQ generating unit 150.

Figure 2A:
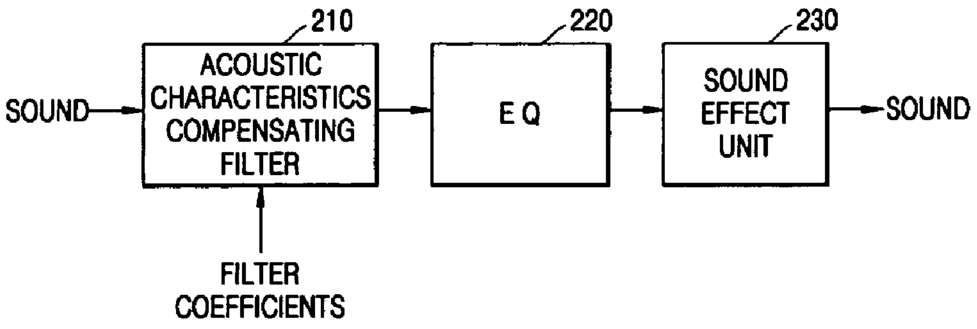
FIGS. 2A and 2B are exemplary block diagrams illustrating a digital filter processing unit of the sound system of FIG. 1.
Figure 2B:
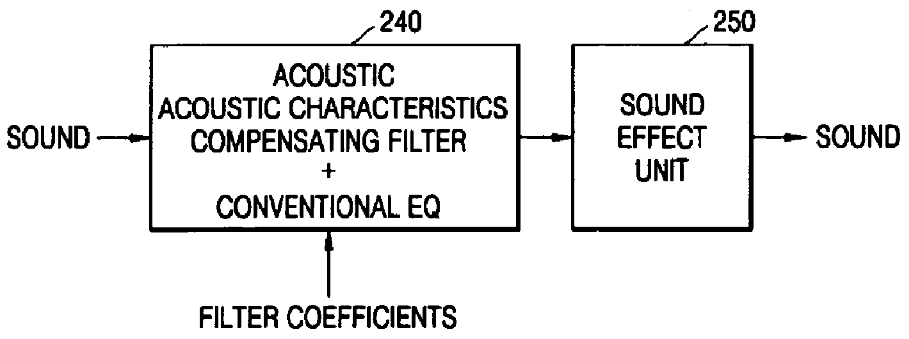

FIGS. 2A and 2B are exemplary block diagrams illustrating the digital filter processing unit 160 of the sound system of FIG. 1.

Referring to FIG. 2A, the digital filter processing unit 160 of the present embodiment includes an acoustic characteristics compensating filter 210, an EQ (equalizer) 220 including modes such as a rock mode or a jazz mode, and a sound effect unit 230 such as a virtualizer.

Referring to FIG. 2B, the digital filter processing unit 160 of the present embodiment includes a filter unit 240, which is a combination of an acoustic characteristics compensating filter and a conventional EQ, and a sound effect unit 250 such as a virtualizer.

Figure 3:
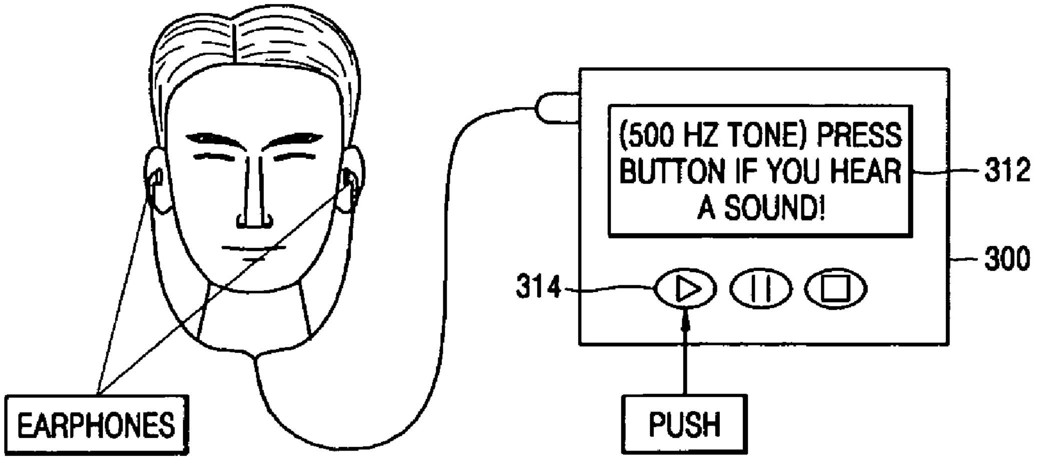
FIG. 3 is a conceptual diagram illustrating an operation of measuring acoustic characteristics of a user according to an embodiment of the present general inventive concept.

FIG. 3 is a conceptual diagram illustrating an operation of measuring the acoustic characteristics of the user according to an embodiment of the present general inventive concept.

Referring to FIG. 3, an apparatus to measure the acoustic characteristics of the user includes a sound system 300 and earphones connected to the sound system 300.

The user puts the earphones in or on their ears and presses a specified button 314 to indicate whenever a signal reproduced by the sound system 300 is heard. The sound system 300 measures the acoustic characteristics of the user whenever the button 314 is pressed by the user. The sound system 300 displays information to check an audibility of a signal in a relevant audio frequency band. For example, the text "press the button if you hear a sound" may be displayed on a display unit 312 to instruct the user accordingly.

Figure 4:
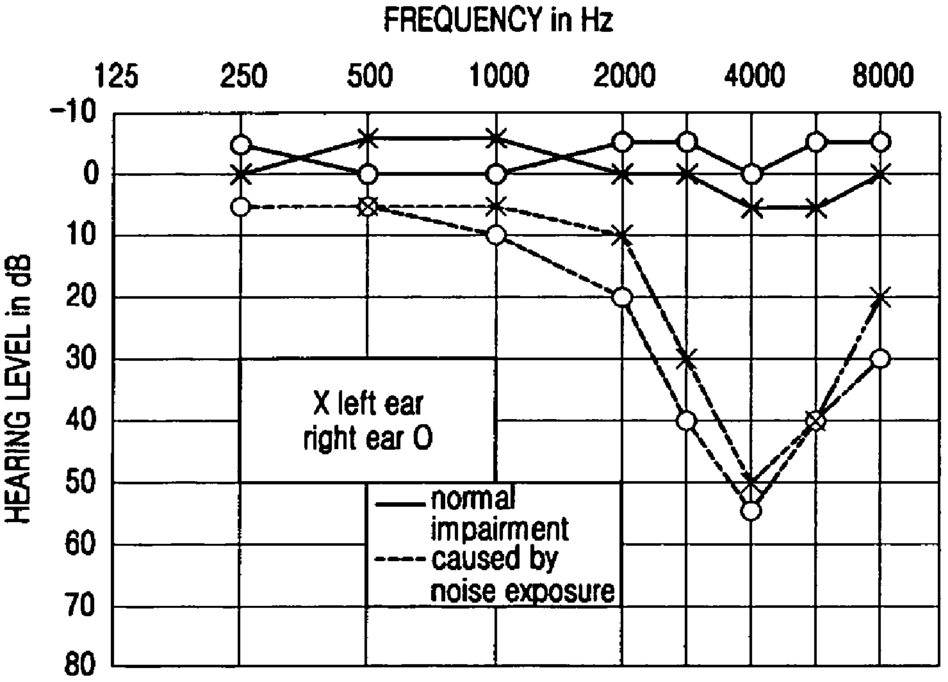
FIG. 4 is a view illustrating an audiogram used in an acoustic characteristics processing unit of the sound system of FIG. 1 according to an embodiment of the present general inventive concept.

FIG. 4 is a view illustrating an audiogram used in the acoustic characteristics processing unit 130 of the sound system of FIG. 1 according to an embodiment of the present general inventive concept.

A hearing threshold (HT), which is the smallest (i.e., softest) sound that is audible by the human ear, and an uncomfortable hearing level (UCL), which is a loud sound that can cause aches or damage to the human ear, are different for each audio frequency band. An audiogram is a graph that illustrates a hearing ability of a user. That is, the audiogram graphs the softest sound that the user can hear. Referring to FIG. 4, the solid line represents an audiogram of a normal acoustic, and the dotted line represents an audiogram of an abnormal acoustic caused by noise exposure. The audiogram illustrated in FIG. 4 is obtained as a result of the user pressing the specified button 314 whenever a sound reproduced by the sound system 300 is heard through the earphones.

Figure 5:
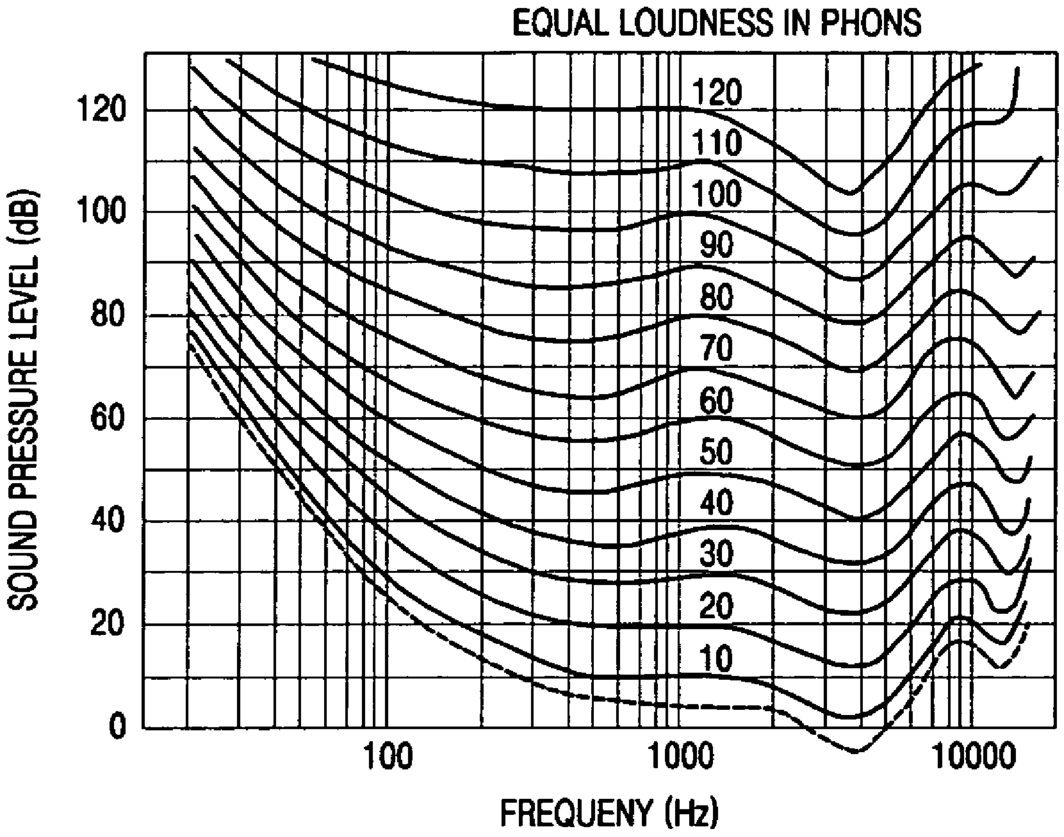
FIG. 5 is a view illustrating a loudness curve used in an equalizer generating unit of the sound system of FIG. 1 according to an embodiment of the present general inventive concept.

FIG. 5 is a view illustrating a loudness curve used in the EQ generating unit 150 of the sound system of FIG. 1 according to an embodiment of the present general inventive concept.

Referring to FIG. 5, a sound of 1000 Hz is a reference sound, and a sound pressure level of the reference sound is set to 0, 10, 20 dB, and so on up to 120 dB. The reference sound and a pure sound of another frequency are alternately input to both earphones for one second each in a free sound field such that a sound pressure level of equal loudness is obtained for the reference sound of 1000 Hz and the pure sound of the other frequency. The obtained sound pressure level curve is called an equal loudness curve. The equal loudness curve has been adopted as an international standard. The equal loudness curve accounts for variations in audibility of certain frequencies. That is, the equal loudness curve represents loudness as perceived by the human ear. For example, the human ear is less sensitive to low frequencies, thus the curve illustrated in FIG. 5 is steeper as the frequency decreases.

The loudness of the pure sound of the other frequency that is heard at the same loudness as the reference sound of 1000 Hz in the equal loudness curve is called a loudness level. The loudness level is measured in "phons." For example, a sound of 40 dB at 200 Hz is measured to have 40 phons. As illustrated in FIG. 5, a sensitivity of the sound is best around 4000 Hz due to a resonance of an auditory canal of the human ear.

In addition, as illustrated in FIG. 5, a minimum audible level of sound cannot be heard unless the sound is quite loud. The loudness level of the sound is different depending on frequency, even if the sound level pressure is the same. Therefore, if the volume of the sound system changes, the level of each frequency component of a tone, which corresponds to the sound, also changes, thereby changing a timbre.

Figure 6:
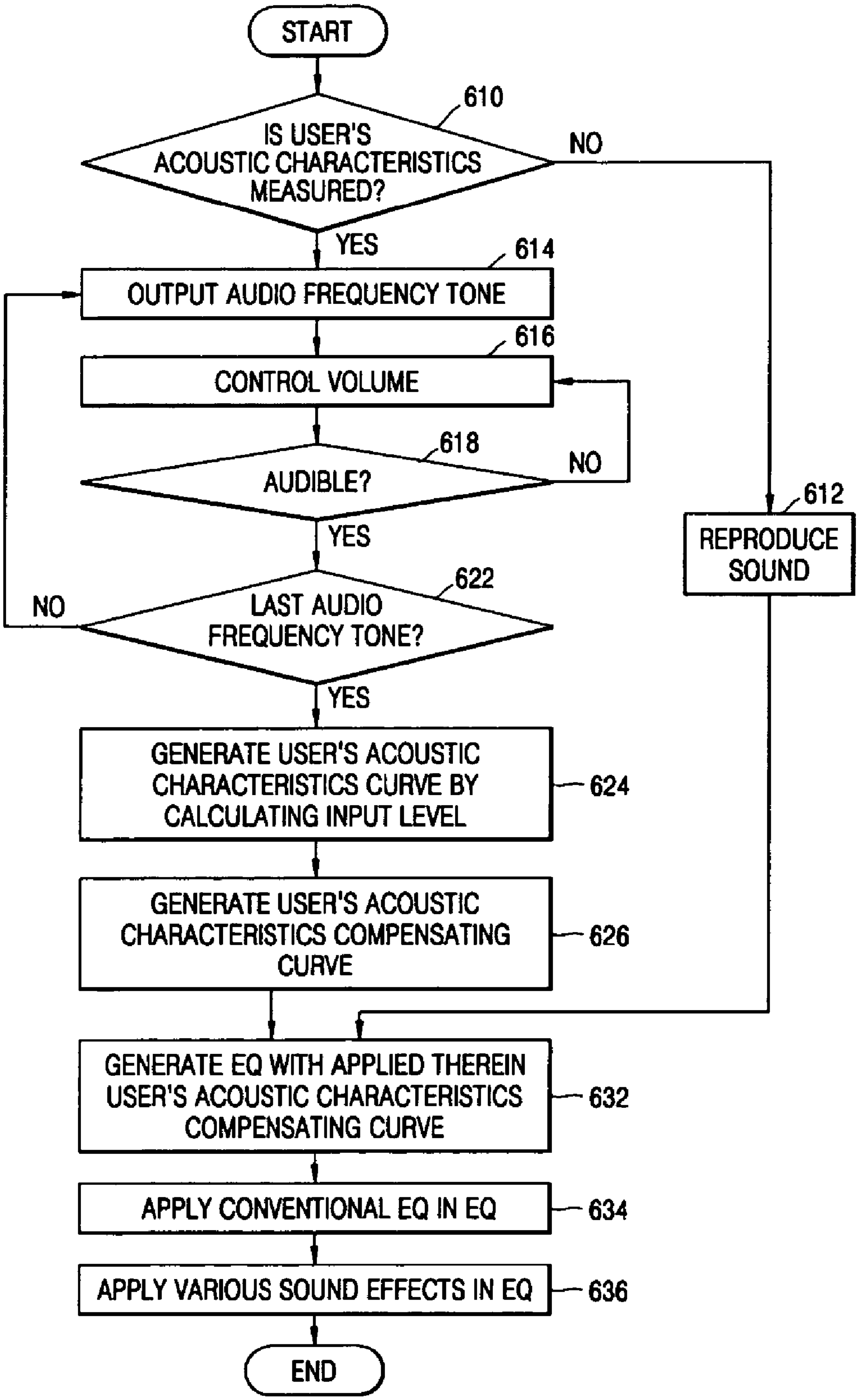
FIG. 6 is a flow chart illustrating a method of compensating audio frequency response characteristics in real-time according to an embodiment of the present general inventive concept.

FIG. 6 is a flow chart illustrating a method of compensating audio frequency response characteristics in real-time according to an embodiment of the present general inventive concept. The method of FIG. 6 may be performed by the sound system illustrated in FIG. 1.

First, it is determined whether the sound system is in the mode used to estimate the acoustic characteristics of the user (i.e., the measuring mode) or the sound reproducing mode (operation 610). If the sound system is in the sound reproducing mode, the sound system reproduces sound (operation 612).

If the sound system is in the measuring mode, the sound system measures the acoustic characteristics of the user, for example, using the audiogram. That is, the audible audio frequency band is divided into a plurality of bandwidths (e.g. 10 bandwidths), and then an audio signal in each of the bandwidths is output to the user (e.g., by the headphones of the earphones) (operation 614). The volume of the audio signal of a specified bandwidth is turned up or down (operation 616) to determine the acoustic level of the user for each of the bandwidths by determining when the user can hear a sound of the audio signal through the headphones or the earphones (operation 618).

If the audio signal of the last bandwidth is checked, the acoustic level of the user that is set for each of the bandwidths is applied to a filter, thereby generating an acoustic characteristics curve of the user (operation 624).

Then, the acoustic compensation curve of the user is generated based on the acoustic characteristics curve of the user and the audio frequency characteristics target curve desired by the user (operation 626). That is, the acoustic compensation curve of the user is generated by applying a value of the audio frequency characteristics target curve to a value of the acoustic characteristics curve of the user. A method of compensating the acoustic characteristics of the user may include a method of compensating the acoustic characteristics by simply making acoustic characteristics of the user flat, a method of compensating the acoustic characteristics in accordance with the loudness curve (see FIG. 4), and/or a method of compensating the acoustic characteristics in accordance with frequency characteristics of a best quality earphone.

An EQ (equalizer) is then generated using the acoustic compensation curve of the user, thereby compensating the audio frequency response characteristics of the sound that is reproduced (operation 632).

A conventional EQ (e.g., having a rock mode, a jazz mode, a classic mode, etc.) and various sound effects EQ (e.g., virtualizer) may be selectively added to the EQ, which has the acoustic characteristics of the user applied therein (operations 634 and 636).

Figure 7:
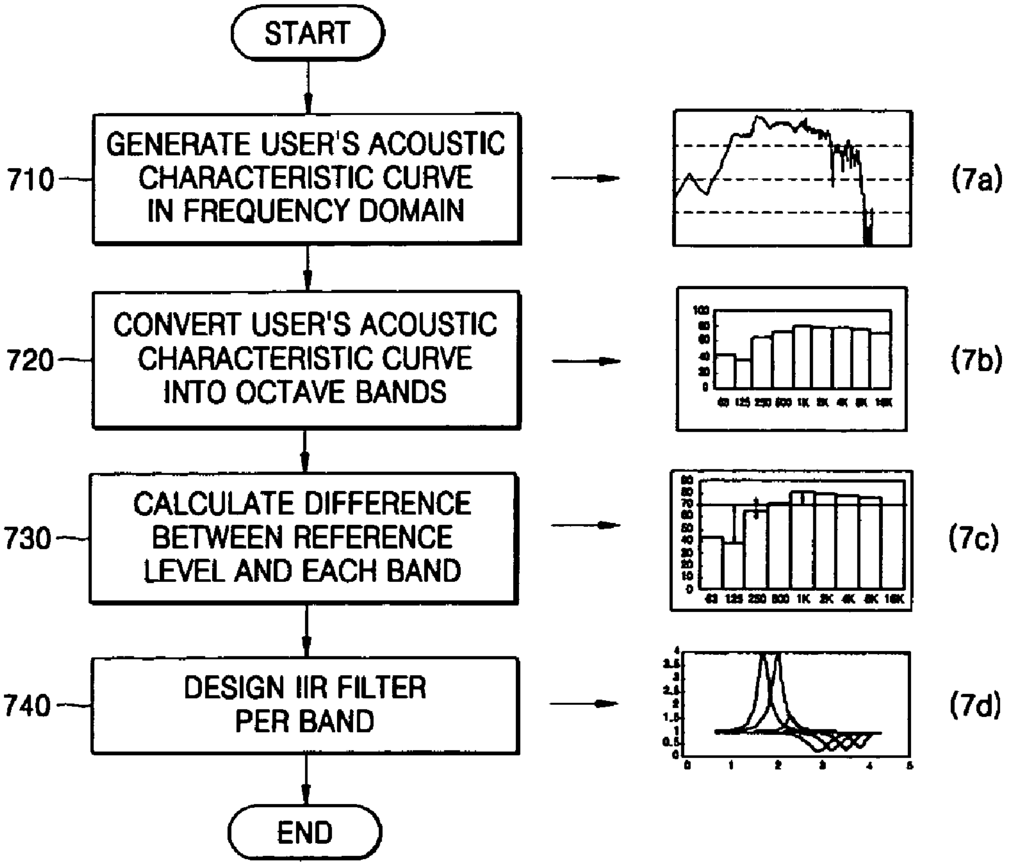
FIG. 7 is a flow chart illustrating a method of creating a digital filter using an acoustic characteristics curve of a user according to an embodiment of the present general inventive concept.

FIG. 7 is a flow chart illustrating a method of creating a digital filter using an acoustic characteristics curve of the user according to an embodiment of the present general inventive concept.

First, an acoustic characteristics curve of the user is generated in the frequency domain using an audiogram method (operation 710). Diagram (7*a*) in FIG. 7 is a view illustrating a waveform of the acoustic characteristics curve of the user measured in the frequency domain.

The acoustic characteristics curve of the user is divided into octave bands by performing octave band transformation, and each of the octave bands is represented as sound pressure levels (operation 720). Diagram (7*b*) in FIG. 7 is a view illustrating waveforms of each of the octave bands illustrated at the representative sound pressure levels.

As illustrated in diagram (7*c*), differences between a predetermined reference level and the representative sound pressure levels of each of the octave bands are then calculated (operation 730).

An infinite impulse response (IIR) filter coefficient, which reflects the sound pressure level differences of the octave bands is then calculated, as illustrated in diagram (7*d*) in FIG. 7 (operation 740).

According to the various embodiments of the present general inventive concept, audio frequency response characteristics can be compensated to suit a specific user using a portable sound system in real-time. In addition, the audio frequency response characteristics can be adjusted using an audiogram examining function even for users who may be deaf or have problems hearing. Furthermore, the audio frequency response characteristics reproduced by the sound system can also be compensated by considering frequency response characteristics of an earphone used together with the sound system in addition to the acoustic characteristics of the user.

The present general inventive concept can be embodied as computer readable codes on a computer readable recording medium. The computer readable recording medium may include any data storage device that can store data which can be thereafter read by a computer system. Examples of the computer readable recording medium include a read-only memory (ROM), a random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. The present general inventive concept may also be embodied in hardware or a combination of hardware and software.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of compensating audio frequency response characteristics of a sound system in real-time, the method comprising:

generating a frequency characteristics target curve based on a desired frequency response set by a user;

displaying information to check audibility of signals in relevant audio frequency bands;

generating an acoustic characteristics curve of a user based on a minimum perception level of the user with respect to audible audio frequency bandwidths using information to check the audibility of the signals;

generating an acoustic compensation curve of the user by comparing the acoustic characteristics curve of the user and the frequency characteristics target curve;

compensating the audio frequency response characteristics of a sound based on the acoustic compensation curve of the user; and selectively applying a predetermined equalizer and a sound effect unit to the acoustic characteristics curve reflecting filter coefficients determined from the acoustic compensation curve of the user, wherein the frequency characteristics target curve comprises a frequency response characteristics curve desired by the user.

2. The method of claim 1, wherein the generating of the acoustic compensation curve of the user comprises:

dividing the audible frequency bandwidths into a plurality of bands;

reproducing an audio signal in each of the bands;

setting an acoustic level of the user for each of the bands when the user first hears a sound of the audio signal through an earphone while controlling a volume of the audio signal in each of the bands; and generating the acoustic characteristics curve of the user based on the acoustic level of the user in each of the bands.

3. The method of claim 1, wherein the generating of the acoustic compensation curve of the user comprises:

dividing the acoustic characteristics curve of the user into bands of a predetermined width and setting a representative sound pressure level for each of the bands;

calculating a difference between the set representative sound pressure level of each of the bands and a predetermined reference level; and setting filter coefficients to reflect the calculated difference between the set representative sound pressure level of each of the bands and the predetermined reference level.

4. The method of claim 1, wherein the predetermined frequency characteristics target curve comprises a frequency response characteristics curve of a best quality earphone.

5. The method of claim 1, wherein the user is a hearing-impaired user.

6. A method of reproducing sound in a sound system, the method comprising:

displaying information to check audibility of signals in relevant audio frequency bands;

detecting acoustic characteristics of a user including an acoustics characteristics curve based on a minimum perception level of the user with respect to the audible audio frequency bands and a desired frequency characteristics target curve based on a desired frequency response set by the user using information to check the audibility of the signals;

reproducing a sound signal and modifying a frequency response curve of the sound signal according to the detected acoustic characteristics of the user;

wherein the modifying of the frequency response curve of the sound signal comprises:

generating a first equalizer that is specific to the detected acoustic characteristics of the user;

equalizing the frequency response curve of the sound signal by applying the first equalizer thereto;

applying a second equalizer having one or more preset equalization modes to the equalized frequency response curve of the sound signal; and applying a virtualizer to the equalized frequency response curve of the sound signal to add one or more sound effects to the equalized sound signal.

7. The method of claim 6, wherein the detecting of the acoustic characteristics of the user comprises receiving a plurality of inputs from the user according to a plurality of sounds heard by the user in a plurality of audible frequency bands.

8. The method of claim 6, wherein the detecting of the acoustic characteristics of the user comprises:

determining a minimum perception level of sound for the user with respect to a plurality of audible frequency bands;

generating an acoustic characteristic curve for the user according to the minimum perception levels; and determining a compensation curve that makes the acoustic characteristic curve of the user a target frequency response curve.

9. The method of claim 8, wherein the modifying of the frequency response of the sound signal comprises applying the compensation curve to the sound signal to change the frequency response curve of the sound signal to the target frequency response curve.

10. The method of claim 6, wherein:

the detecting of the acoustic characteristics of the user comprises determining a user characteristics curve; and the modifying of the frequency response curve of the sound signal comprises generating filter coefficients according to the determined user characteristics curve and filtering the frequency response curve of the sound signal according to the generated filter coefficients.

11. The method of claim 6, wherein:

the detecting of the acoustic characteristics of the user comprises determining an equal loudness curve at a plurality of audible frequencies; and the modifying of the frequency response curve of the sound signal comprises flattening the frequency response curve of the sound signal using the determined equal loudness curve.

12. The method of claim 6, wherein:

the detecting of the acoustic characteristics of the user comprises generating an audiogram of a hearing ability of the user according to one or more user inputs; and the modifying of the frequency response curve of the sound signal comprises equalizing a plurality of frequency components of the frequency response curve of the sound signal according to the generated audiogram.

13. The method of claim 6, wherein:

the detecting of the acoustic characteristics of the user comprises:

generating an audiogram in a frequency domain, dividing the audiogram into octave bands each having a representative sound pressure level, determining differences between each of the representative sound pressure levels and a reference sound pressure level, and generating one or more infinite impulse response (IIR) coefficients to reflect the differences between the representative sound pressure levels and the reference sound pressure level; and the modifying of the frequency response curve of the sound signal comprises applying the one or more IIR coefficients to a filter to filter the frequency response curve of the sound signal.

14. A sound system, comprising:

a sound reproducing unit to reproduce a sound from a predetermined recording medium;

a display unit to display information to check audibility of signals in relevant audio frequency bands;

an acoustic characteristics processing unit to generate an acoustic characteristics curve of a user based on a minimum perception level of the user with respect to an audible audio frequency band using information to check the audibility of the signals and to generate a frequency characteristics target curve based on a desired frequency response set by the user;

an equalizer to generate filter coefficients that correspond to an acoustic compensation curve of the user by comparing the acoustic characteristics curve of the user and a predetermined frequency characteristics target curve; and a digital filter processing unit to compensate frequency response characteristics of the sound that is reproduced by the sound reproducing unit according to the filter coefficients generated by the equalizer, wherein the digital filter processing unit comprises an acoustic compensation filter, a predetermined equalizer, and a predetermined sound effect unit that are arranged together, wherein the predetermined frequency characteristics target curve comprises a frequency response characteristics curve desired by the user.

15. The sound system of claim 14, wherein the acoustic characteristics processing unit comprises:

a signal output unit to output audio signals for each of a plurality of bands within the audible frequency band;

a volume controller to control a volume of the audio signal that corresponds to one of the bands output by the signal output unit;

a display unit to display information to determine whether the volume controlled audio signal is audible by the user;

a user input unit to output a signal when the user presses a button to indicate that a sound of the volume controlled audio signal is audible when the user hears the sound through an earphone; and an acoustic level setting unit to set an acoustic level of the user for each of the bands in the audible frequency band when the button is pressed at the user input unit and to generate an acoustic characteristics curve of the user by applying the acoustic levels of the user to a filter.

16. A method of compensating audio frequency response characteristics, the method comprising:

generating a frequency characteristics target curve based on a desired frequency response set by a user;

displaying information to check audibility of signals in relevant audio frequency bands;

generating an acoustic characteristics curve of the user by checking levels of each of a plurality of bands in a frequency domain using information to check the audibility of the signals;

dividing the acoustic characteristics curve and the frequency characteristics target curve into respective curve bands of a predetermined width and setting a representative sound pressure level for each of the respective curve bands;

calculating a difference between the representative sound pressure level of each of the respective curve bands;

generating an acoustic compensation curve of the user by comparing the difference between the representative sounds pressure level of each of the respective curve bands;

setting filter coefficients of the acoustic compensation curve according to the calculated difference between the representative sound level of each of the respective curve bands; and selectively applying a predetermined equalizer and a sound effect unit to the acoustic compensation curve.

* * * * *